United States Patent
Li et al.

(10) Patent No.: US 11,846,675 B2
(45) Date of Patent: Dec. 19, 2023

(54) BATTERY TEMPERATURE ESTIMATION METHOD AND APPARATUS, ELECTRONIC DEVICE, AND STORAGE MEDIUM

(71) Applicant: BYD COMPANY LIMITED, Shenzhen (CN)

(72) Inventors: Xiaoqian Li, Shenzhen (CN); Tianyu Feng, Shenzhen (CN); Sijia Liu, Shenzhen (CN); Yonggang Yin, Shenzhen (CN); Shiwei Shu, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 40 days.

(21) Appl. No.: 17/764,340

(22) PCT Filed: Sep. 25, 2020

(86) PCT No.: PCT/CN2020/117853
§ 371 (c)(1),
(2) Date: Mar. 28, 2022

(87) PCT Pub. No.: WO2021/057917
PCT Pub. Date: Apr. 1, 2021

(65) Prior Publication Data
US 2022/0357399 A1    Nov. 10, 2022

(30) Foreign Application Priority Data

Sep. 29, 2019   (CN) .......................... 201910935416.5

(51) Int. Cl.
G01R 31/367    (2019.01)
G01R 31/389    (2019.01)
G01R 31/382    (2019.01)
G01R 31/374    (2019.01)

(52) U.S. Cl.
CPC .......... *G01R 31/367* (2019.01); *G01R 31/374* (2019.01); *G01R 31/382* (2019.01); *G01R 31/389* (2019.01)

(58) Field of Classification Search
CPC ... G01R 31/374; G01R 31/389; G01R 31/367
(Continued)

(56) References Cited

U.S. PATENT DOCUMENTS 6,137,269 A * 10/2000 Champlin ......... H02J 7/007194
374/E7.042
2012/0256569 A1   10/2012 Kawahara et al.
(Continued)

FOREIGN PATENT DOCUMENTS

CN    100440614 C    12/2008
CN    104865534 A    8/2015
(Continued)

OTHER PUBLICATIONS

The World Intellectual Property Organization (WIPO) International Search Report for PCT/CN2020/117853 dated Dec. 30, 2020 5 pages (with translation).

*Primary Examiner* — Ricky Go
(74) *Attorney, Agent, or Firm* — Wenye Tan

(57) ABSTRACT

A battery temperature estimation method includes fitting, when a battery is in an offline state, a first function relationship according to corresponding admittances of the battery at different test temperatures, and obtaining a temperature distribution model of the battery according to the shape and the size of the battery, and determining a second function relationship corresponding to internal temperatures and a surface temperature by combining with the first function relationship. The second function relationship is
(Continued)

used for estimating the internal temperature of the battery by using the surface temperature and the admittances of the battery.

16 Claims, 6 Drawing Sheets

(58) Field of Classification Search
USPC .......................................................... 702/63
See application file for complete search history.

(56) References Cited

U.S. PATENT DOCUMENTS

2016/0103184 A1  4/2016  Kawai et al.
2019/0190296 A1* 6/2019  Paralikar ........... H02J 7/007188

FOREIGN PATENT DOCUMENTS

| | | |
|---|---|---|
| CN | 105264709 A | 1/2016 |
| CN | 105510843 A | 4/2016 |
| CN | 106289566 A | 1/2017 |
| CN | 106772075 A | 5/2017 |
| CN | 106842050 A | 6/2017 |
| CN | 106872904 A | 6/2017 |
| CN | 107192952 A | 9/2017 |
| CN | 104865534 B | 12/2017 |
| CN | 106289566 B | 12/2018 |
| CN | 109425833 A | 3/2019 |
| CN | 109799005 A | 5/2019 |
| CN | 109921111 A | 6/2019 |
| JP | 2018037332 A | 3/2018 |
| WO | 2013177442 A1 | 11/2013 |

* cited by examiner

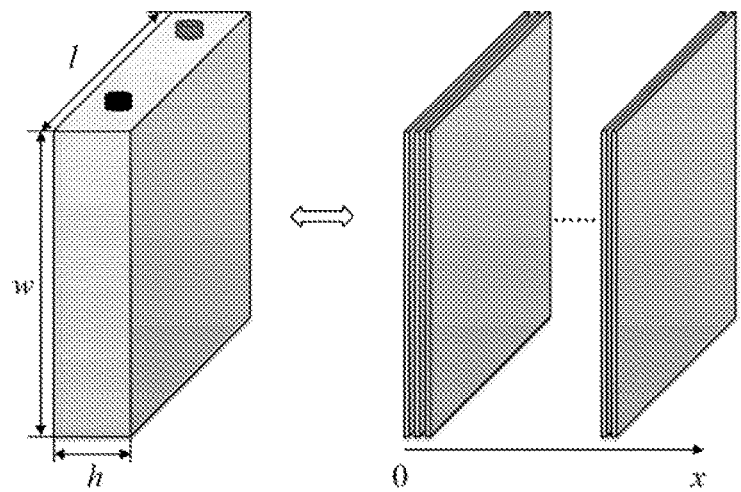

FIG. 3

```
Determine a feature test frequency when the battery is in the offline state, where
the feature test frequency is within a target frequency range, and in the target     — S401
frequency range, impedance of the battery does not change with a state of charge
                                of the battery
                                       ↓
Determine real parts of the corresponding admittances of the battery at different    — S402
          test temperatures according to the feature test frequency
                                       ↓
Fit the first function relationship according to the different test temperatures and — S403
          the real parts of the corresponding admittances
                                       ↓
Obtain a temperature distribution model of the battery according to the shape and
      the size of the battery, and determine a second function relationship
    corresponding to internal temperatures and a surface temperature by using the    — S404
    first function relationship, the second function relationship being used for
estimating the internal temperature of the battery by using the surface temperature
                       and the admittances of the battery
```

FIG. 4

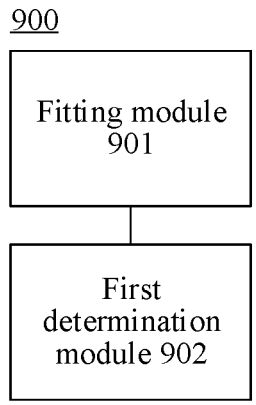
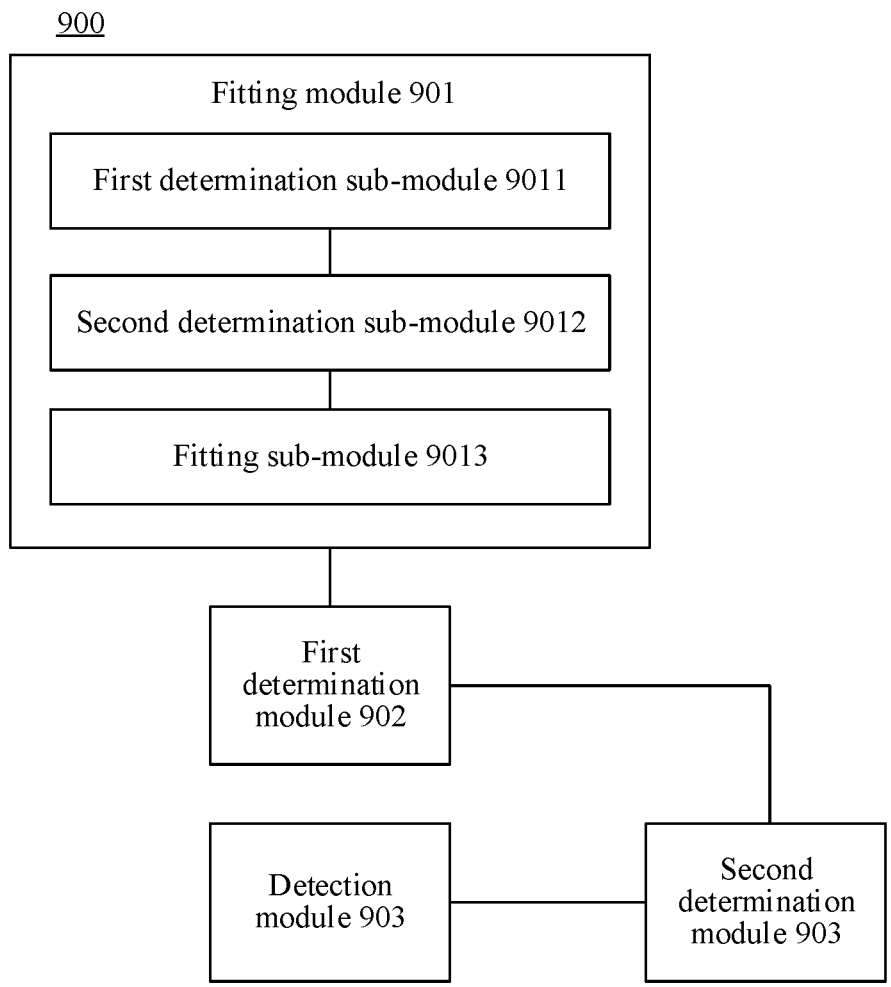
FIG. 10

BATTERY TEMPERATURE ESTIMATION METHOD AND APPARATUS, ELECTRONIC DEVICE, AND STORAGE MEDIUM

CROSS-REFERENCE TO RELATED APPLICATIONS

This application is a national stage entry under 35 U.S.C. § 371 of International Application No. PCT/CN2020/117853, filed on Sep. 25, 2020, which claims priority to Chinese Patent Application No. 201910935416.5, entitled "BATTERY TEMPERATURE ESTIMATION METHOD AND APPARATUS, ELECTRONIC DEVICE, AND STORAGE MEDIUM" and filed on Sep. 29, 2019, the entire contents of all of which are incorporated herein by reference.

FIELD

The present disclosure relates to the field of battery technologies, and in particular, to a battery temperature estimation method and apparatus, an electronic device, and a storage medium.

BACKGROUND

In the related art, the internal temperature of a power battery of a new energy vehicle is estimated in real time by collecting a current, a voltage, and a battery surface temperature. Alternatively, the internal temperature of the power battery of the new energy vehicle is estimated by obtaining a relationship between feature quantities of electrochemical impedance spectroscopy and an ambient temperature in a stable state and measured impedance values. However, in such methods, the effect of real-time charging and discharging states of the battery on the actually measured impedance values is not considered, and the obtained internal temperature is actually the average temperature of the entire battery rather than the actual temperature inside the battery, so that the estimation precision of the internal temperature of the battery is not high.

SUMMARY

The present disclosure provides a battery temperature estimation method and apparatus, an electronic device, and a storage medium, which can estimate the internal temperature of the battery by using admittances that are measured in real time and surface temperature of the battery, thereby effectively improving the estimation precision of the internal temperature of the battery.

According to a first aspect, an embodiment of the present disclosure provides a battery temperature estimation method, including: fitting, when a battery is in an offline state, a first function relationship according to corresponding admittances of the battery at different test temperatures; and obtaining a temperature distribution model of the battery according to the shape and the size of the battery, and determining a second function relationship corresponding to internal temperatures and a surface temperature by combining with the first function relationship, the second function relationship being used for estimating the internal temperature of the battery by using the surface temperature and the admittances of the battery.

In the battery temperature estimation method provided in the embodiments of the present disclosure, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

According to a second aspect, an embodiment of the present disclosure provides a battery temperature estimation apparatus, including: a fitting module, configured to fit, when a battery is in an offline state, a first function relationship according to corresponding admittances of the battery at different test temperatures; and a first determination module, configured to obtain a temperature distribution model of the battery according to the shape and the size of the battery, and determine a second function relationship corresponding to internal temperatures and a surface temperature by combining with the first function relationship, the second function relationship being used for estimating the internal temperature of the battery by using the surface temperature and the admittances of the battery.

In the battery temperature estimation apparatus provided in the embodiments of the present disclosure, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

According to a third aspect, an embodiment of the present disclosure provides an electronic device, including a memory, a processor, and a computer program stored in the memory and executable on the processor, the processor, when executing the program, implementing the battery temperature estimation method provided in the embodiment of the first aspect of the present disclosure.

In the electronic device provided in the embodiments of the present disclosure, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

According to a fourth aspect, an embodiment of the present disclosure provides a computer-readable storage medium, storing a computer program, the program, when executed by a processor, implementing the battery temperature estimation method provided in the embodiment of the first aspect of the present disclosure.

In the computer-readable storage medium provided in the embodiments of the present disclosure, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible in the description made with reference to the following accompanying drawings, where:

FIG. 3 is a schematic diagram of discretization of a square battery in an embodiment of the present disclosure;

FIG. 4 is a schematic flowchart of a battery temperature estimation method according to another embodiment of the present disclosure;

FIG. 9 is a schematic structural diagram of a battery temperature estimation apparatus according to an embodiment of the present disclosure;

FIG. 10 is a schematic structural diagram of a battery temperature estimation apparatus according to another embodiment of the present disclosure.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are merely intended to explain the present disclosure and cannot be construed as a limitation to the present disclosure. On the contrary, the embodiments of the present disclosure include all changes, modifications, and equivalents falling within the spirit and scope of the appended claims.

To resolve the technical problem in the related art that the effect of real-time charging and discharging states of the battery on the actually measured impedance values is not considered, and the obtained internal temperature is actually the average temperature of the entire battery rather than the actual temperature inside the battery, so that the estimation precision of the internal temperature of the battery is not high, an embodiment of the present disclosure provides a battery temperature estimation method. When a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

Figure 1:
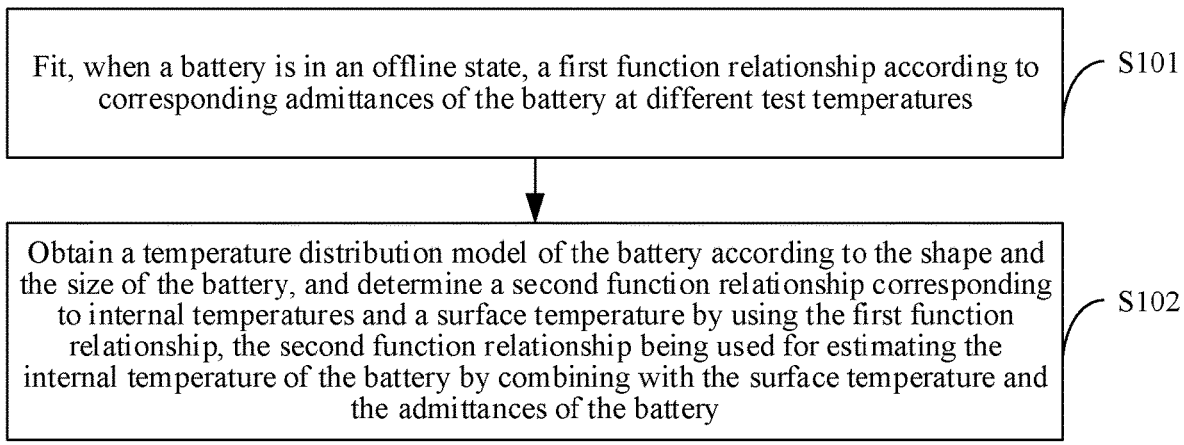
FIG. 1 is a schematic flowchart of a battery temperature estimation method according to an embodiment of the present disclosure.

FIG. 1 is a schematic flowchart of a battery temperature estimation method according to an embodiment of the present disclosure.

Referring to FIG. 1, the method includes the following steps:

S101. Fit, when a battery is in an offline state, a first function relationship according to corresponding admittances of the battery at different test temperatures.

The offline state indicates that the battery is currently in a test environment, or may indicate that the battery is not charged or discharged. This is not limited.

During specific execution, when a battery is in an offline state, a first function relationship is fitted according to corresponding admittances of the battery at different test temperatures.

During specific execution, real parts of the corresponding admittances of the battery at different test temperatures may be determined, and the first function relationship is fitted according to the different test temperatures and the real parts of the corresponding admittances. The first function relationship is used for describing a correspondence between different test temperatures and the real parts of the corresponding admittances of the battery. The concept of admittance is introduced to simplify the calculation formula and reduce the calculation amount, thereby reducing the requirement on the chip calculation capacity.

During specific execution, the first function relationship may be fitted according to the different test temperatures, the real parts of the corresponding admittances, and an Arrhenius formula.

Figure 2:
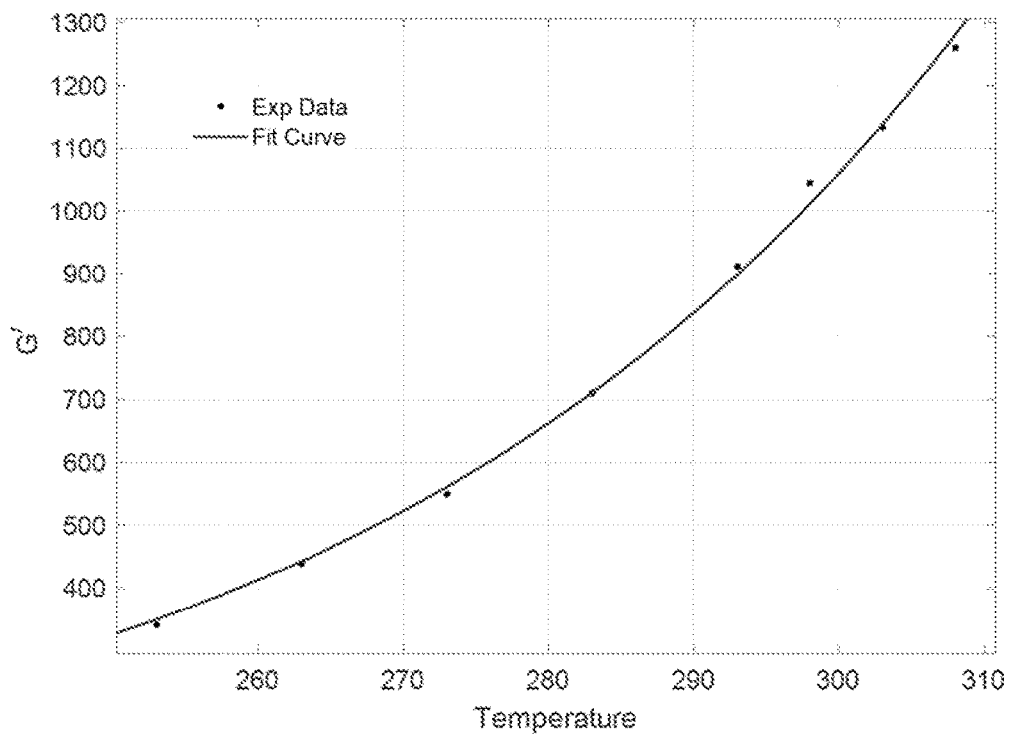
FIG. 2 is a schematic diagram of a curve of a first function relationship according to an embodiment of the present disclosure.

For example, according to the Arrhenius formula, $G'=Ae^{RT/E_a}$, where A is a constant, Ea is activation energy, and R is a universal gas constant. The relationship between the real parts of the admittances and temperatures may be represented as $G'=Ae^{bT}$. Fitting is performed according to testing data, to obtain parameters A=0.8976, and b=0.02358. FIG. 2 is a schematic diagram of a curve of a first function relationship according to an embodiment of the present disclosure.

S102. Obtain a temperature distribution model of the battery according to the shape and the size of the battery, and determine a second function relationship corresponding to internal temperatures and a surface temperature by combining with the first function relationship, the second function relationship being used for estimating the internal temperature of the battery by using the surface temperature and the admittances of the battery.

In this embodiment, when a temperature distribution model of the battery is obtained according to the shape and the size of the battery, and a second function relationship corresponding to internal temperatures and a surface temperature is determined by combining with the first function relationship, the first function relationship may be integrated and the second function relationship of the battery may be determined according to the temperature distribution model and the integrated first function relationship.

The temperature distribution model is used for describing a correspondence among temperatures at different locations inside the battery, the highest internal temperature of the battery, and the surface temperature of the battery.

During specific execution, a function relationship among temperatures T(x) at different locations, the highest internal temperature of the battery, and the surface temperature of the battery may be determined according to a one-dimensional steady heat-conduction equation and used as the temperature distribution model, for example, $$T(x) = f(T_{max}, T_0, x) = -\frac{\Phi}{2\lambda}\left(x-\frac{h}{2}\right)^2 + \left(\frac{\Phi}{4\lambda}h - \frac{2(T_{max}-T_0)}{h}\right)\left|x-\frac{h}{2}\right| + T_0,$$

where $T_{max}$ indicates the highest internal temperature of the battery, $T_0$ indicates the surface temperature of the battery, x indicates different locations inside the battery, h is the thickness of the battery, $\Phi$ is a current heat flow rate of the battery, and $\lambda$ is a thermal conductivity coefficient of the battery.

The shape of the battery may be, for example, regular or irregular. The shape of the battery may be, for example, hexahedral. In the embodiments of the present disclosure, an example in which the shape of the battery is square is given, and this is not limited.

In an example, the square battery may be regarded as being formed by a plurality of battery sheets that are discretized along a thickness direction of the battery. The plurality of battery sheets are, for example, N battery sheets, where N is a positive integer greater than or equal to 2. The battery may be discretized in advance into N battery sheets along the thickness direction. FIG. 3 is a schematic diagram of discretization of a square battery in an embodiment of the present disclosure. The square battery is discretized into N battery sheets along the thickness direction, each battery sheet may correspond to a corresponding location on an x coordinate axis, and a plurality of corresponding locations may correspond to x in the foregoing temperature distribution model T(x).

During specific execution, when the temperature distribution model of the battery is obtained according to the shape and the size of the battery, and the second function relationship corresponding to internal temperatures and a surface temperature is determined by combining with the first function relationship, the first function relationship may be integrated and the second function relationship of the battery may be determined according to the temperature distribution model and the integrated first function relationship.

In an example, the real part of the admittance measured in the first function relationship in the foregoing step is to be accumulation of all the real parts of the admittances of the battery, that is, $G'=\Sigma Ae^{bT_k}=\int_0^h Ae^{bT(x)}dx$, where $k \in [0, \infty]$, $T_k$ indicates the temperature corresponding to the $k^{th}$ battery sheet, a specific value of $T_k$ is related to a location of the battery sheet in the battery, and h is a thickness value of the battery. After that, according to the temperature distribution model, that is, $T(x)=f(T_{max},T_0,x)$, the temperature T(x) at different locations is a function of the highest internal temperature and the surface temperature of the battery, where $T_{max}$ indicates the highest internal temperature of the battery, $T_0$ indicates the surface temperature of the battery, and x indicates different locations inside the battery. $T(x)=f(T_{max},T_0,x)$ is substituted into the integrated first function relationship $G'=Ae^{bT_k}=\int_0^h Ae^{bT(x)}dx$, the function relationship obtained after substitution is used as the second function relationship, and the second function relationship is used for fitting a correspondence among the surface temperature of the battery, the admittances of the battery, and the internal temperature of the battery.

In this embodiment, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

FIG. 4 is a schematic flowchart of a battery temperature estimation method according to another embodiment of the present disclosure.

Referring to FIG. 4, the method includes the following steps:

S401. Determine a feature test frequency when the battery is in the offline state, where the feature test frequency is within a target frequency range, and in the target frequency range, impedance of the battery does not change with a state of charge of the battery.

The feature test frequency is obtained through pre-testing, and is a frequency within a target frequency range, and in the target frequency range, impedance of the battery does not change with a state of charge of the battery. The feature test frequency is used for performing in-situ admittance testing on the battery.

During specific execution, in the process of determining the feature test frequency, electrochemical impedance spectroscopy testing may be performed on the battery in a preset frequency range in different states of charge, the target frequency range is determined from the preset frequency range according to a result of the testing, response values of electrochemical impedance spectroscopy of the battery are tested in a preset state of charge at different temperatures, the response values are converted into the corresponding admittances, and a frequency at which real parts of the admittances change most with temperatures in the target frequency range is determined as the feature test frequency. By performing in-situ admittance testing on the battery based on the feature test frequency, a standard relationship between in-situ admittance testing data and ambient temperature data can be effectively established, thereby reducing an estimation error and improving the estimation precision.

Certainly, during actual execution, the feature test frequency may be determined in any other possible manners. For example, the feature test frequency may be determined by using the conventional programming technology (such as a simulation method and an engineering method). In another example, the feature test frequency may be determined by using a genetic algorithm and an artificial neural network method.

The preset frequency range may be preset according to actual testing experience, and the preset frequency range may be 0.01 Hz to 1 kHz.

Figure 5:
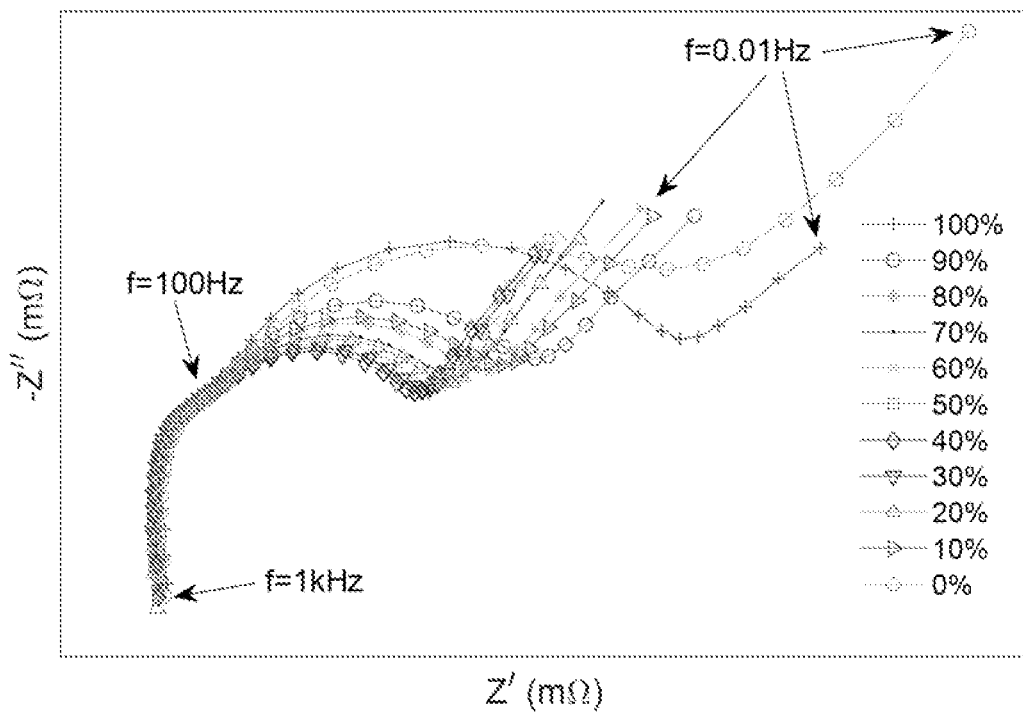
FIG. 5 is a schematic diagram of an EIS curve according to an embodiment of the present disclosure.

In an example, electrochemical impedance spectroscopy testing is performed on the battery in a preset frequency range in different states of charge, and the target frequency range is determined from the preset frequency range according to a result of the testing. For example, at room temperature (25° C.), the states of charge (SOC) of a square battery cell having a capacity of 50 Ah are adjusted respectively to 0%, 10%, 20%, 30%, 40%, 50%, 60%, 70%, 80%, 90%, 100% at a rate of 0.5 C, and then electrochemical impedance spectroscopy (EIS) testing is performed. The preset frequency range is 0.01 Hz to 1 kHz, and a frequency interval in which impedance does not change with the state of charge is obtained by analyzing a testing result and is used as a target frequency range. The target frequency range is 100 Hz to 1 kHz. FIG. 5 is a schematic diagram of an EIS curve according to an embodiment of the present disclosure.

Figure 6:
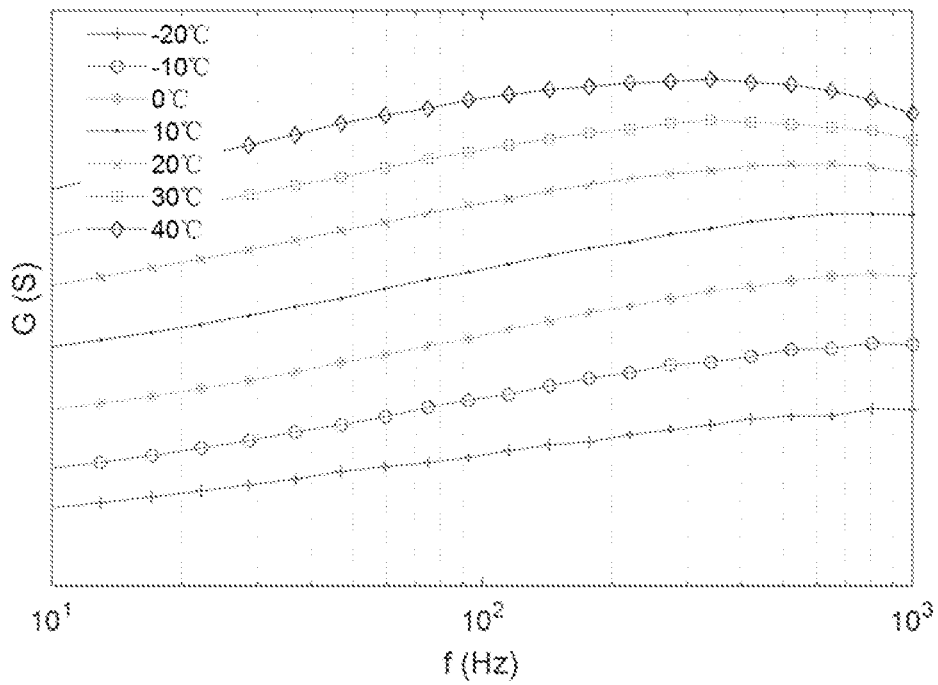
FIG. 6 is a schematic diagram of response curves of the admittances with temperatures in a state of charge of 50% according to an embodiment of the present disclosure.

In an example, response values of electrochemical impedance spectroscopy of the battery are tested in a preset state of charge at different temperatures, the response values are converted into the corresponding admittances, and a frequency at which real parts of the admittances change most with temperatures in the target frequency range is determined as the feature test frequency. For example, in the SOC of 50%, after the square battery is placed in environments with respective temperatures of −20° C., −10° C., 0° C., 10° C., 20° C., 30° C., and 40° C. to fully stand, response values of electrochemical impedance spectroscopy at different temperatures are tested, and the response values of the impedance are converted into the corresponding admittances. A frequency at which real parts of the admittances change most with temperatures is determined in the foregoing determined target frequency range of 100 Hz to 1 kHz, and the frequency is determined as the feature test frequency $f_0$=200 Hz. FIG. 6 is a schematic diagram of response curves of the admittances with temperatures in a state of charge of 50% according to an embodiment of the present disclosure.

S402. Determine real parts of the corresponding admittances of the battery at different test temperatures according to the feature test frequency.

In an example, the feature test frequency is $f_0$=200 Hz. In-situ testing is performed on admittances of the battery in charging and discharging states in environments with temperatures of −20° C., −10° C., 0° C., 10° C., 20° C., 30° C., and 40° C., and real parts G' of the admittances are extracted. After that, step S403 is triggered.

S403. Fit the first function relationship according to the different test temperatures and the real parts of the corresponding admittances.

S404. Obtain a temperature distribution model of the battery according to the shape and the size of the battery, and determine a second function relationship corresponding to internal temperatures and a surface temperature by combining with the first function relationship, the second function relationship being used for estimating the internal temperature of the battery by using the surface temperature and the admittances of the battery.

In an example, the real part of the admittance measured in the first function relationship in the foregoing step is to be accumulation of all the real parts of the admittances of the battery, that is, $G' = \Sigma A e^{bT_k} = \int_0^h A e^{bT(x)} dx$, where $k \in [0, \infty]$, $T_k$ indicates the temperature corresponding to the $k^{th}$ battery sheet, a specific value of $T_k$ is related to a location of the battery sheet in the battery, and h is a thickness value of the battery. After that, according to the temperature distribution model, that is, $T(x) = f(T_{max}, T_0, x)$, the temperature $T(x)$ at different locations is a function of the highest internal temperature and the surface temperature of the battery, where $T_{max}$ indicates the highest internal temperature of the battery, $T_0$ indicates the surface temperature of the battery, and x indicates different locations inside the battery. $T(x) = f(T_{max}, T_0, x)$ is substituted into the integrated first function relationship $G' = \Sigma A e^{bT_k} = \int_0^h A e^{bT(x)} dx$, the function relationship obtained after substitution is used as the second function relationship, and the second function relationship is used for fitting a correspondence among the surface temperature of the battery, the admittances of the battery, and the internal temperature of the battery.

In this embodiment, by performing in-situ admittance testing on the battery based on the feature test frequency, a standard relationship between in-situ admittance testing data and ambient temperature data can be effectively established, thereby reducing an estimation error and improving the estimation precision. When a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

Figure 7:
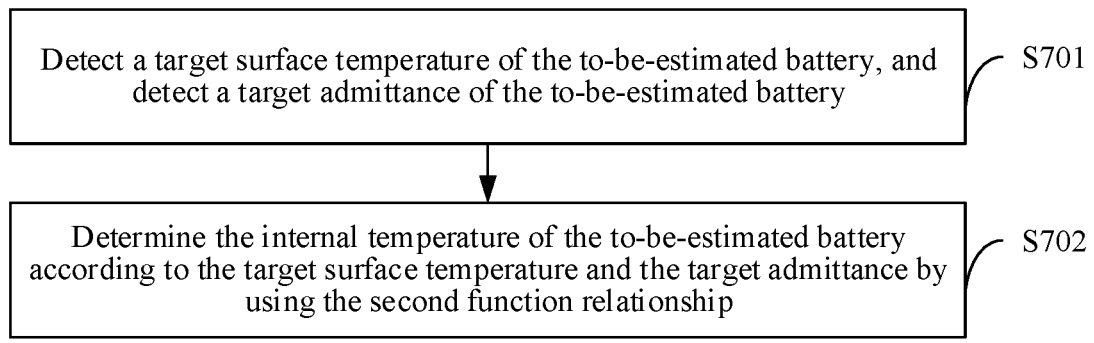
FIG. 7 is a schematic flowchart of a battery temperature estimation method according to an embodiment of the present disclosure.

FIG. 7 is a schematic flowchart of a battery temperature estimation method according to an embodiment of the present disclosure.

Referring to FIG. 7, the method includes the following steps:

S701. Detect a target surface temperature of the to-be-estimated battery, and detect a target admittance of the to-be-estimated battery.

A temperature sensor may be disposed on the to-be-estimated battery in advance, to detect a target surface temperature of the to-be-estimated battery in real time, and detect a target admittance of the to-be-estimated battery in real time.

S702. Determine the internal temperature of the to-be-estimated battery according to the target surface temperature and the target admittance by using the second function relationship.

During specific execution, $T(x)=f(T_{max},T_0,x)$ is substituted into the integrated first function relationship $G'=\Sigma Ae^{bT_k}=\int_0^h Ae^{bT(x)}dx$, and the function relationship obtained after substitution is used as the second function relationship, where $T_{max}$ indicates the highest internal temperature of the battery, and $T_0$ indicates the surface temperature of the battery. Therefore, the target surface temperature and the target admittance may be substituted into the second function relationship to determine $T_{max}$, and $T_{max}$ obtained through calculation is used as the actual temperature inside the battery, thereby estimating the highest internal temperature of the battery.

Figure 8:
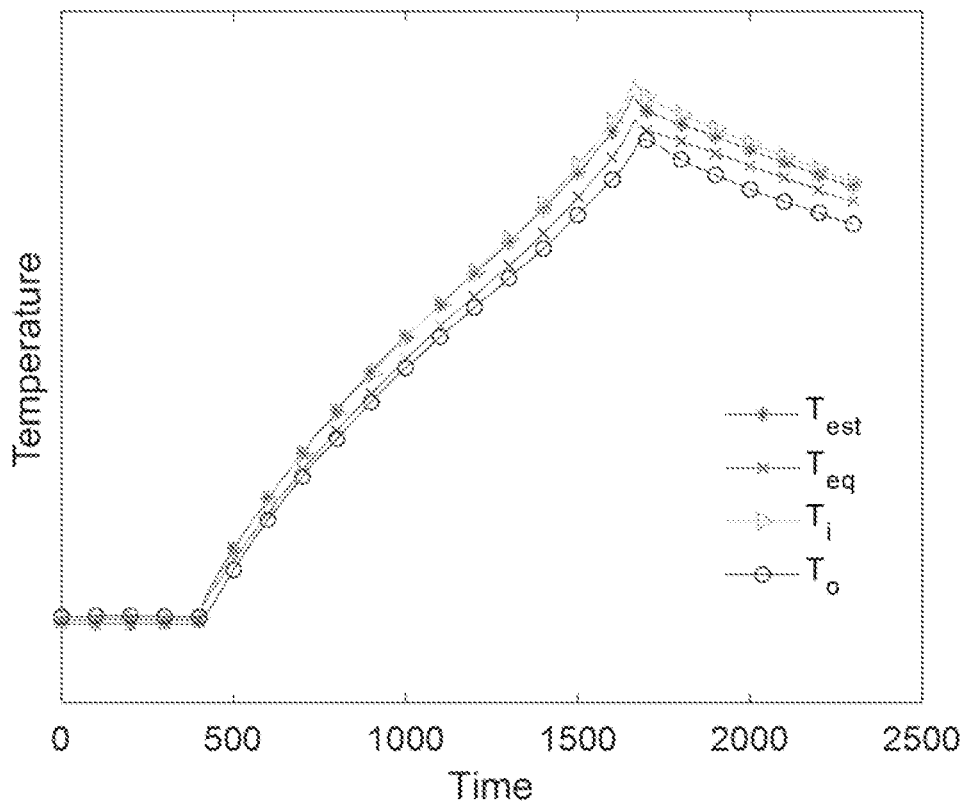
FIG. 8 is a schematic diagram of a temperature change curve in a battery charging process according to an embodiment of the present disclosure.

During specific execution of the embodiments of the present disclosure, for temperatures tested through experiments and the result of estimation in the embodiments of the present disclosure, reference may be made to FIG. 8. FIG. 8 is a schematic diagram of a temperature change curve in a battery charging process according to an embodiment of the present disclosure. Four temperature time curves respectively represent the internal temperature $T_{est}$ of the battery that is estimated in the embodiments of the present disclosure, equivalent temperature $T_{eq}$ of the entire battery, internal temperature $T_i$ of the battery that is actually tested, and surface temperature $T_0$ of the battery. Compared with the surface temperature of the battery and the equivalent temperature of the entire battery, the internal temperature of the battery that is estimated in the embodiments of the present disclosure is closer to the internal temperature of the battery that is actually measured.

In this embodiment, the target surface temperature of the to-be-estimated battery and the target admittance of the to-be-estimated battery are detected, and the internal temperature of the to-be-estimated battery is determined according to the target surface temperature and the target admittance by using the second function relationship. The internal temperature distribution of the battery is considered, and the highest internal temperature can be accurately given for estimation of the internal temperature of the field test battery. Therefore, a battery management system may further optimize the working status of the battery according to the internal temperature, thereby ensuring that the battery works in a safe temperature range, eliminating the hidden dangers of flammability and explosiveness, and improving the safety and reliability of battery operation.

FIG. 9 is a schematic structural diagram of a battery temperature estimation apparatus according to an embodiment of the present disclosure.

Referring to FIG. 9, the apparatus 900 includes: a fitting module 901, configured to fit, when a battery is in an offline state, a first function relationship according to corresponding admittances of the battery at different test temperatures; and a first determination module 902, configured to obtain a temperature distribution model of the battery according to the shape and the size of the battery, and determine a second function relationship corresponding to internal temperatures and a surface temperature by combining with the first function relationship, the second function relationship being used for estimating the internal temperature of the battery by using the surface temperature and the admittances of the battery.

In some embodiments, referring to FIG. 10, the fitting module 901 includes: a first determination sub-module 9011, configured to determine a feature test frequency when the battery is in the offline state, where the feature test frequency is within a target frequency range, and in the target frequency range, impedance of the battery does not change with a state of charge of the battery; a second determination sub-module 9012, configured to determine the corresponding admittances of the battery at different test temperatures according to the feature test frequency; and a fitting sub-module 9013, configured to fit the first function relationship according to the different test temperatures and the corresponding admittances.

Optionally, in some embodiments, referring to FIG. 10, the apparatus 900 further includes: a detection module 903, configured to detect a target surface temperature of the to-be-estimated battery, and detect a target admittance of the to-be-estimated battery; and a second determination module 904, configured to determine the internal temperature of the to-be-estimated battery according to the target surface temperature and the target admittance by using the second function relationship.

In some embodiments, the first determination sub-module 9011 is specifically configured to: perform electrochemical impedance spectroscopy testing on the battery in a preset frequency range in different states of charge; determine the target frequency range from the preset frequency range according to a result of the testing; test response values of electrochemical impedance spectroscopy of the battery in a preset state of charge at different temperatures, and convert the response values into the corresponding admittances; and determine a frequency at which real parts of the admittances change most with temperatures in the target frequency range as the feature test frequency.

In some embodiments, the fitting sub-module 9013 is specifically configured to fit the first function relationship according to the different test temperatures, the real parts of the corresponding admittances, and an Arrhenius formula.

In some embodiments, the first determination module 902 is specifically configured to integrate the first function relationship; and determine the second function relationship of the battery according to the temperature distribution model and the integrated first function relationship.

In some embodiments, the battery is square.

It should be noted that the explanation of the embodiment of the battery temperature estimation method in the above embodiments of FIG. 1 to FIG. 8 is also applicable to the battery temperature estimation apparatus 900 of this embodiment, and the implementation principle thereof is similar, so that details are omitted herein.

In this embodiment, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

Figure 11:
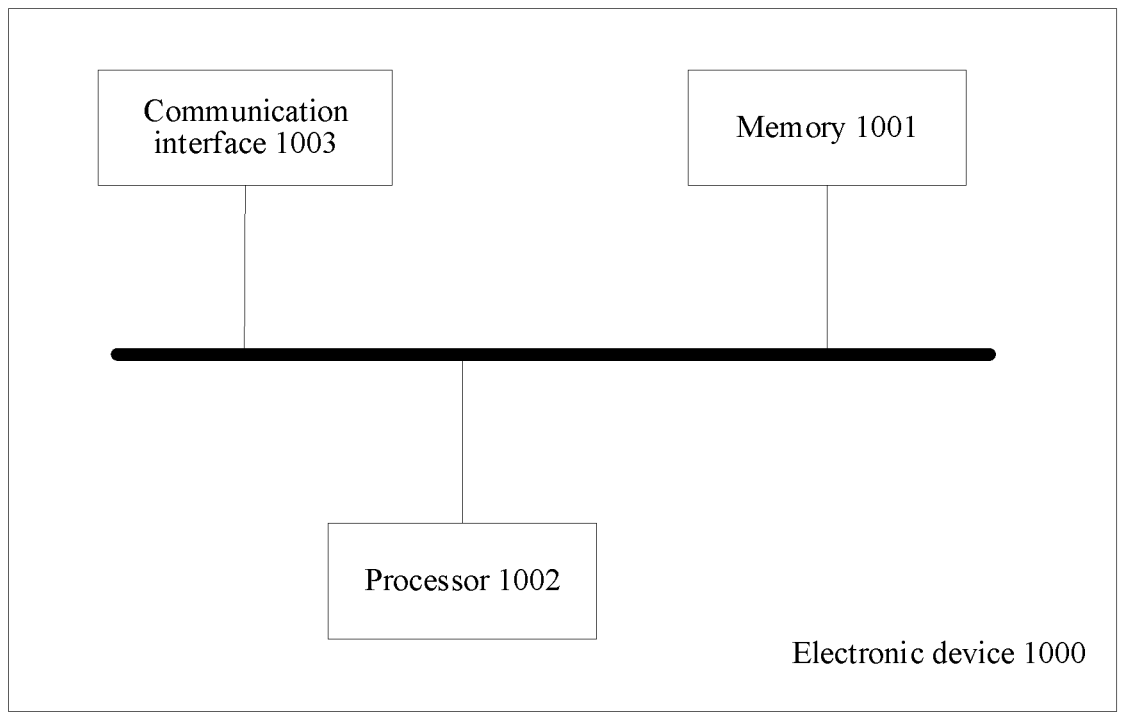
FIG. 11 is a schematic structural diagram of an electronic device according to an embodiment of the present disclosure.

FIG. 11 is a schematic structural diagram of an electronic device according to an embodiment of the present disclosure.

The electronic device 1000 includes: a memory 1001, a processor 1002, and a computer program stored in the memory 1001 and executable on the processor 1002. The processor 1002, when executing the program, implements the battery temperature estimation method in the foregoing embodiments.

In a possible implementation, the electronic device further includes a communication interface 1003, configured to perform communication between the memory 1001 and the processor 1002.

In this embodiment, when a battery is in an offline state, a first function relationship is fitted according to corresponding admittances of the battery at different test temperatures, a temperature distribution model of the battery is obtained according to the shape and the size of the battery, and a second function relationship corresponding to internal temperatures and a surface temperature is determined by combining with the first function relationship, the second function relationship being used for estimating the internal temperature of the battery by using the surface temperature and the admittances of the battery. Therefore, the internal temperature of the battery can be estimated by using the admittances that are measured in real time and the surface temperature of the battery, thereby effectively improving the estimation precision of the internal temperature of the battery.

This embodiment further provides a computer-readable storage medium, storing a computer program, the computer program, when executed by a processor, implementing the foregoing battery temperature estimation method.

It should be noted that in the description of the present disclosure, the terms "first", "second", and the like are merely used for description, and shall not be understood as an indication or implication of relative importance. In addition, in the description of the present disclosure, unless otherwise stated, "a plurality of" means two or more than two.

Any process or method in the flowcharts or described herein in another manner may be understood as indicating a module, a segment, or a part including code of one or more executable instructions for implementing a particular logical function or process step. In addition, the scope of exemplary embodiments of the present disclosure includes other implementations which do not follow the order shown or discussed, including performing, according to involved functions, the functions basically simultaneously or in a reverse order, which should be understood by technical personnel in the technical field to which the embodiments of the present disclosure belong.

It should be understood that, parts of the present disclosure can be implemented by using hardware, software, firmware, or a combination thereof. In the foregoing implementations, a plurality of steps or methods may be implemented by using software or firmware that are stored in a memory and are executed by a proper instruction execution system. For example, if hardware is used for implementation, same as in another implementation, implementation may be performed by any one of the following technologies well known in the art or a combination thereof: a discrete logic circuit of a logic gate circuit for realizing a logic function for a data signal, an application-specific integrated circuit having a suitable combined logic gate circuit, a programmable gate array (PGA), and a field programmable gate array (FPGA).

A person of ordinary skill in the art may understand that all or some of the steps of the methods in the foregoing embodiments may be implemented by a program instructing relevant hardware. The program may be stored in a computer-readable storage medium. When the program is executed, one or a combination of the steps of the method embodiments are performed.

In addition, the functional modules in the embodiments of the present disclosure may be integrated into one processing module, or each of the units may exist alone physically, or two or more units may be integrated into one module. The integrated module may be implemented in the form of hardware, or may be implemented in a form of a software functional module. If implemented in the form of software functional modules and sold or used as an independent product, the integrated module may also be stored in a computer-readable storage medium.

The storage medium mentioned above may be a read-only memory, a magnetic disk, an optical disc, or the like.

In the description of the present specification, reference to the description of the terms "one embodiment", "some embodiments", "examples", "specific examples", or "some examples", and the like means that specific features, structures, materials, or characteristics described in connection with the embodiment or example are included in at least one embodiment or example of the present disclosure. In this specification, exemplary descriptions of the foregoing terms do not necessarily refer to the same embodiment or example. In addition, the described specific features, structures, materials, or characteristics may be combined in a proper manner in any one or more of the embodiments or examples.

Although the embodiments of the present disclosure have been shown and described above, it can be understood that, the foregoing embodiments are exemplary and should not be understood as limitation to the present disclosure. A person of ordinary skill in the art can make changes, modifications, replacements, or variations to the foregoing embodiments within the scope of the present disclosure.

What is claimed is:

1. A battery temperature estimation method, comprising:
   fitting, when a battery is in an offline state, a first function relationship according to corresponding admittances of the battery at different test temperatures; and
   obtaining a temperature distribution model of the battery according to the shape and the size of the battery, and determining a second function relationship corresponding to internal temperatures and a surface temperature by combining with the first function relationship, the second function relationship being used for estimating the internal temperature of the battery by using the surface temperature and the admittances of the battery,
   wherein the fitting a first function relationship according to corresponding admittances of the battery at different test temperatures further includes:
      determining a feature test frequency when the battery is in the offline state, wherein the feature test frequency is within a target frequency range, and in the target frequency range, impedance of the battery does not change with a state of charge of the battery,
   wherein the determining a feature test frequency further includes:

performing electrochemical impedance spectroscopy testing on the battery in a preset frequency range in different states of charge;

determining the target frequency range from the preset frequency range according to a result of the testing;

testing response values of electrochemical impedance spectroscopy of the battery in a preset state of charge at different temperatures, and converting the response values into the corresponding admittances; and determining a frequency at which real parts of the admittances change most with temperatures in the target frequency range as the feature test frequency.

2. The battery temperature estimation method according to claim 1, wherein the fitting a first function relationship according to corresponding admittances of the battery at different test temperatures further comprises:

determining the corresponding admittances of the battery at different test temperatures according to the feature test frequency; and fitting the first function relationship according to the different test temperatures and the corresponding admittances.

3. The battery temperature estimation method according to claim 2, wherein the fitting the first function relationship according to the different test temperatures and the corresponding admittances comprises:

fitting the first function relationship according to the different test temperatures, the corresponding real parts of the admittances, and an Arrhenius formula.

4. The battery temperature estimation method according to claim 3, further comprising:

detecting a target surface temperature of the to-be-estimated battery, and detecting a target admittance of the to-be-estimated battery; and determining the internal temperature of the to-be-estimated battery according to the target surface temperature and the target admittance by combining with the second function relationship.

5. The battery temperature estimation method according to claim 2, further comprising:

detecting a target surface temperature of the to-be-estimated battery, and detecting a target admittance of the to-be-estimated battery; and determining the internal temperature of the to-be-estimated battery according to the target surface temperature and the target admittance by combining with the second function relationship.

6. The battery temperature estimation method according to claim 1, further comprising:

detecting a target surface temperature of the to-be-estimated battery, and detecting a target admittance of the to-be-estimated battery; and determining the internal temperature of the to-be-estimated battery according to the target surface temperature and the target admittance by combining with the second function relationship.

7. The battery temperature estimation method according to claim 1, wherein the obtaining a temperature distribution model of the battery according to the shape and the size of the battery, and determining a second function relationship corresponding to internal temperatures and a surface temperature by combining with the first function relationship comprises:

performing the integrating on the first function relationship; and determining the second function relationship of the battery according to the temperature distribution model and the integrated first function relationship.

8. The battery temperature estimation method according to claim 1, wherein the battery is square.

9. A non-transitory computer readable medium containing computer instructions stored therein for causing a computer processor to perform steps according to claim 1.

10. A battery temperature estimation apparatus, comprising:

a fitting module, configured to fit, when a battery is in an offline state, a first function relationship according to corresponding admittances of the battery at different test temperatures; and a first determination module, configured to obtain a temperature distribution model of the battery according to the shape and the size of the battery, and determine a second function relationship corresponding to internal temperatures and a surface temperature by combining with the first function relationship, the second function relationship being used for estimating the internal temperature of the battery by combining with the surface temperature and the admittances of the battery, wherein the fitting module further comprises:

a first determination sub-module, configured to determine a feature test frequency when the battery is in the offline state, wherein the feature test frequency is within a target frequency range, and in the target frequency range, impedance of the battery does not change with a state of charge of the battery, wherein the first determination sub-module is specifically configured to:

perform electrochemical impedance spectroscopy testing on the battery in a preset frequency range in different states of charge;

determine the target frequency range from the preset frequency range according to a result of the testing;

test response values of electrochemical impedance spectroscopy of the battery in a preset state of charge at different temperatures, and convert the response values into the corresponding admittances; and determine a frequency at which real parts of the admittances change most with temperatures in the target frequency range as the feature test frequency.

11. The battery temperature estimation apparatus according to claim 10, wherein the fitting module further comprises:

a second determination sub-module, configured to determine the corresponding admittances of the battery at different test temperatures according to the feature test frequency; and a fitting sub-module, configured to fit the first function relationship according to the different test temperatures and the corresponding admittances.

12. The battery temperature estimation apparatus according to claim 11, further comprising:

a detection module, configured to detect a target surface temperature of the to-be-estimated battery, and detect a target admittance of the to-be-estimated battery; and a second determination module, configured to determine the internal temperature of the to-be-estimated battery according to the target surface temperature and the target admittance by using the second function relationship.

13. The battery temperature estimation apparatus according to claim 10, wherein the fitting sub-module is specifically configured to:

fit the first function relationship according to the different test temperatures, the corresponding real parts of the admittances, and an Arrhenius formula.

14. The battery temperature estimation apparatus according to claim 10, wherein the first determination module is specifically configured to:
    integrate the first function relationship; and
    determine the second function relationship of the battery according to the temperature distribution model and the integrated first function relationship.

15. The battery temperature estimation apparatus according to claim 10, wherein the battery is square.

16. An electronic device, comprising:
    a memory, a processor, and a computer program stored in the memory and executable on the processor, the processor, when executing the program, implementing a battery temperature estimation method to perform:
    fitting, when a battery is in an offline state, a first function relationship according to corresponding admittances of the battery at different test temperatures; and
    obtaining a temperature distribution model of the battery according to the shape and the size of the battery, and determining a second function relationship corresponding to internal temperatures and a surface temperature by combining with the first function relationship, the second function relationship being used for estimating the internal temperature of the battery by using the surface temperature and the admittances of the battery,
    wherein the fitting a first function relationship according to corresponding admittances of the battery at different test temperatures further includes:
      determining a feature test frequency when the battery is in the offline state, wherein the feature test frequency is within a target frequency range, and in the target frequency range, impedance of the battery does not change with a state of charge of the battery,
    wherein the determining a feature test frequency further includes:
      performing electrochemical impedance spectroscopy testing on the battery in a preset frequency range in different states of charge;
      determining the target frequency range from the preset frequency range according to a result of the testing;
      testing response values of electrochemical impedance spectroscopy of the battery in a preset state of charge at different temperatures, and converting the response values into the corresponding admittances; and
      determining a frequency at which real parts of the admittances change most with temperatures in the target frequency range as the feature test frequency.

* * * * *